United States Patent
Hepworth et al.

(10) Patent No.: US 10,366,178 B2
(45) Date of Patent: Jul. 30, 2019

(54) MULTI-USER CAX EDITING OF A MODEL OF A DESIGN OBJECT

(71) Applicant: Brigham Young University, Provo, UT (US)

(72) Inventors: Ammon Hepworth, Provo, UT (US); Daniel Staves, Orem, UT (US); Logan Hill, Provo, UT (US); Kevin Tew, Provo, UT (US); Charles Greg Jensen, Provo, UT (US); Walter Edward Red, Provo, UT (US)

(73) Assignee: Brigham Young University, Provo, UT (US)

( * ) Notice: Subject to any disclaimer, the term of this patent is extended or adjusted under 35 U.S.C. 154(b) by 571 days.

(21) Appl. No.: 14/606,911

(22) Filed: Jan. 27, 2015

(65) Prior Publication Data

US 2015/0213157 A1    Jul. 30, 2015

Related U.S. Application Data

(60) Provisional application No. 61/931,807, filed on Jan. 27, 2014.

(51) Int. Cl.
 *G06F 17/50* (2006.01)
(52) U.S. Cl.
 CPC .................. *G06F 17/50* (2013.01)
(58) Field of Classification Search
 CPC ........................................ G06F 17/50
 USPC ............................................. 703/1
 See application file for complete search history.

(56) References Cited

U.S. PATENT DOCUMENTS

| | | |
|---|---|---|
| 6,868,297 B1 | 3/2005 | Rimoldi et al. |
| 2003/0221172 A1 | 11/2003 | Brathwaite |
| 2006/0250418 A1 | 11/2006 | Chartier et al. |
| 2008/0126019 A1 | 5/2008 | Lanzarotta et al. |
| 2010/0042377 A1* | 2/2010 | Seroussi ............ G06F 17/5004 703/1 |
| 2012/0317497 A1 | 12/2012 | Red et al. |

OTHER PUBLICATIONS

Red et al. (v-CAx: A research Agenda for Collaborative Computer-Aided Applications, 2010 (18 pages)).*
Red et al. (Multi-User Architectures for Computer-Aided Engineering Collaboration, 2011 (10 pages)).*
Yang et al. (Repairing CAD model errors based on the design history, 2006 (14 pages)).*
PCT/US2015/013139, Notification of Transmittal of the International Search Report and the Written Opinion of the International Searching Authority, or the Declaration, dated May 7, 2015.

* cited by examiner

*Primary Examiner* — Andre Pierre Louis
(74) *Attorney, Agent, or Firm* — Kunzler Bean & Adamson

(57) ABSTRACT

A computer-implemented method for multi-user CAx editing of a model of a design object may include (1) identifying one or more geometric elements referenced in response to creating a feature within the model of the design object, (2) receiving a feature operation that references the geometric elements referenced in response to creating the feature, (3) in response to receiving the feature operation, identifying a geometric element referenced by the feature operation, and (4) generating a unique persistent label for the geometric element. Various other methods and systems are also disclosed herein.

16 Claims, 8 Drawing Sheets

700

| Client Feature Table 720 | | |
|---|---|---|
| Feature Name | Feature Type | Feature Creation Data |
| dan_feature_3 | Fillet | 11625 |
| dan_feature_4 | Chamfer | 11626 |

| Client Entity Dictionary 730 | | |
|---|---|---|
| Entity Name | Geometric ID | Entity Memory Pointer |
| dan_feature_3_edge_1 | Edge[{(10,15,20)(5,15,20)(0,15,20)}Body_1] | 0x5A884 [Edge27] |
| dan_feature_3_edge_2 | Edge[{(10,0,20)(10,7.5,20)(10,15,20)}Body_1] | 0x03D20 [Edge32] |
| dan_feature_4_edge_1 | Edge[{(10,15,15)(10,15,7.5)(10,15,0)}Body_1] | 0x332F3 [Edge34] |

MULTI-USER CAX EDITING OF A MODEL OF A DESIGN OBJECT

CROSS-REFERENCE TO RELATED APPLICATIONS

This application claims the benefit of U.S. provisional application 61/931,807 entitled "Enhancements for Improved Topological Entity Identification Performance in Multi-user CAD" and filed on 27 Jan. 2014. The foregoing application is incorporated herein by reference.

BACKGROUND

Technical Field

The subject matter disclosed herein relates to computer aided technologies (CAx) such as computer aided design, engineering, analysis and manufacture in general and apparatus, systems, means, and methods for multi-user CAx editing in particular.

Discussion of the Background

Large design and engineering projects require coordination of the efforts of many designers or engineers, and efficient utilization of their efforts calls for multi-user CAx systems that allow designers and engineers to simultaneously work on a model. Two major challenges in the design of multi-user CAx systems are: (1) providing consistent views of the design model and references to geometric entities for all users, and (2) designing a system efficient enough to respond to user input without significant delays while operations and received and processed for a large number of users.

Existing CAx systems, however, are not well-suited to multi-user design and editing. For example, some multi-user CAx systems enable multiple users to view and modify a single, centralized copy of a design model. This architecture addresses the consistency issue by providing only one copy of the model for all users. However, providing views of the shared model to multiple clients involves transmitting a significant amount of data over the network. Other CAx systems replicate the design model database for each of the clients. This architecture implies a lower volume of data communication, but presents challenges in maintaining data consistency between client copies of the design model and managing conflicts between clients.

Given the foregoing, what is needed is additional and improved systems and methods for computer-assisted design and analysis of engineering objects, in particular, systems and methods that facilitate multiple simultaneous users. The embodiments disclosed herein were developed in response to these issues.

SUMMARY OF THE INVENTION

As will be described in greater detail below, the subject matter disclosed herein describes various systems and methods for multi-user CAx editing of a model of a design object. In one example, a computer-implemented method for multi-user CAx editing of a model of a design object includes (1) identifying one or more geometric elements referenced in response to creating a feature within the model of the design object, (2) receiving a feature operation that references the geometric elements referenced in response to creating the feature, (3) in response to receiving the feature operation, identifying a geometric element referenced by the feature operation, and (4) generating a unique persistent label for the geometric element.

In one embodiment, the geometric element may include a body, a face, an edge, and/or a vertex. In some examples, determining the geometric element referenced by the feature operation may include identifying a body on which the geometric element resides. In some examples, identifying the body on which the geometric element resides may include identifying a feature that created the body and/or identifying a bounding box encompassing the body.

In one embodiment, a system for implementing the above-described method may include several modules stored in memory, such as (1) an identification module that identifies at least one geometric element referenced in response to creating a feature within the model of the design object, (2) a feature operation module that receives a feature operation that references the geometric element created in response to creating the feature, (3) a geometry module that, in response to receiving the feature operation, identifies the geometric element referenced by the feature operation, and (4) a labeling module that generates a unique persistent label for the geometric element. The system may also include at least one physical processor configured to execute the identification module, the feature operation module, the geometry module, and the labeling module.

In one example, a computer-implemented method for multi-user CAx editing of a model of a design object includes (1) receiving, on a server storing a shared model of the design object, an update message from a client that includes (a) a feature operation that references at least one geometric element of the design object, (b) a unique persistent label for the geometric element, and (c) one or more distinguishing parameters for the geometric element, (2) adding the feature operation to a feature record in a feature table of a shared model of the design object, (3) identifying the geometric element in a geometric element record in a geometric element table of the shared model of the design object, (4) updating the distinguishing parameters for the geometric element in the geometric element table, (5) referencing the geometric element in the feature record for the feature operation, and (6) referencing the feature operation in the geometric element record for the geometric element.

In some examples, the computer-implemented method may further include transmitting the update message to one or more additional clients. In some examples, identifying the geometric element in the geometric element table may include searching the geometric element table using the unique persistent label for the geometric element. In some examples, identifying the geometric element in the geometric element table may include searching the geometric element table using the distinguishing parameters for the geometric element and adding the unique persistent label for the geometric element to the geometric element table.

In one embodiment, a system for implementing the above-described method may include several modules stored in memory, such as (1) a receiving module that receives, on a server storing a shared model of the design object, an update message from a client that includes (a) a feature operation that references one or more geometric elements of the design object, (b) a unique persistent label for the geometric element, and (c) one or more distinguishing parameters for the geometric element, (2) an feature update module that adds the feature operation to a feature record in a feature table of a shared model of the design object, (3) an geometry identification module that identifies the geometric element in a geometric element record in a geometric element table of the shared model of the design object, (4) a geometry update module that updates the distinguishing parameters for the geometric element in the geometric element table, and (5) a referencing module that references the geometric element in the feature record for the feature operation and references the feature operation in the geometric element record for the geometric element. The system may also include at least one physical processor configured to execute the receiving module, the feature update module, the geometry identification module, the geometry update module, and the referencing module.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
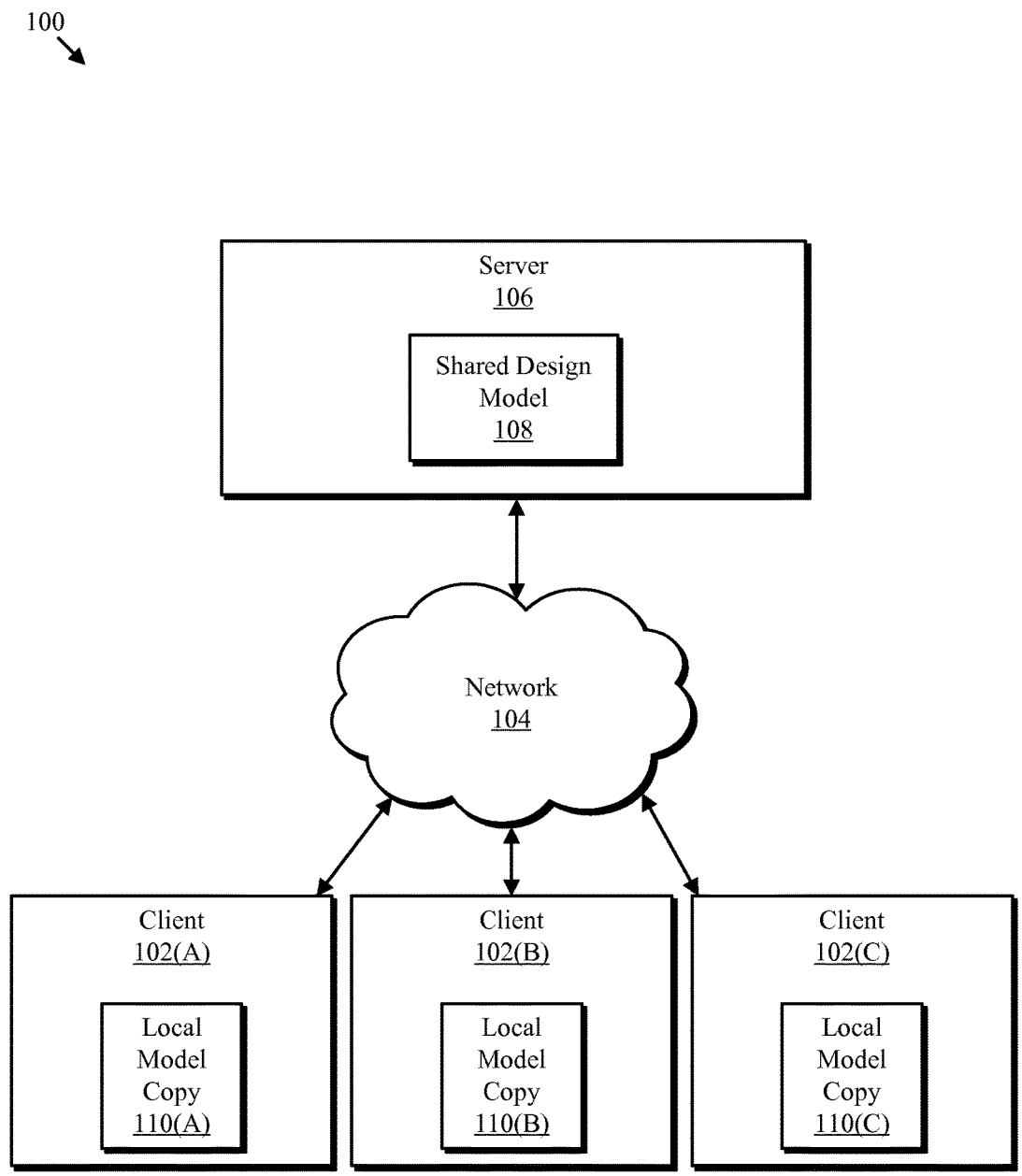
FIG. 1 is a schematic drawing of a system for multi-user CAx editing of a model of a design object.

Some of the functional units described in this specification have been labeled as modules, in order to more particularly emphasize their implementation independence. Others are assumed to be modules. For example, a module or similar unit of functionality may be implemented as a hardware circuit comprising custom VLSI circuits or gate arrays, off-the-shelf semiconductors such as logic chips, transistors, or other discrete components. A module may also be implemented with programmable hardware devices such as field programmable gate arrays, programmable array logic, programmable logic devices or the like.

A module or a set of modules may also be implemented (in whole or in part) as a processor configured with software to perform the specified functionality. An identified module may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, enable the module to achieve the intended purpose for the module.

Indeed, the executable code of a module may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any tangible form capable of enabling execution of a program of machine-readable instructions on a digital processing apparatus. For example, a computer readable medium may be embodied by a flash drive, compact disk, digital-video disk, a magnetic tape, a magnetic disk, a punch card, flash memory, integrated circuits, or other digital processing apparatus memory device. A digital processing apparatus such as a computer may store program codes, associated data, and the like on the computer readable medium that when retrieved enable the digital processing apparatus to execute the functionality specified by the modules.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The present disclosure is generally directed to systems and methods for multi-user CAx editing of a model of a design object. As will be explained in greater detail below, systems and methods described herein may provide a high level of performance when creating and modifying features of a design object by identifying and naming geometric elements only when they are referenced by a feature operation. Systems and methods described herein may provide additional performance enhancements by normalizing data tables for both shared and local copies of a design model.

The following will provide, with reference to FIGS. 1-3 and 6-8, detailed descriptions of exemplary systems for multi-user CAx editing of a model of a design object. Detailed descriptions of corresponding computer-implemented methods will also be provided in connection with FIGS. 4 and 5.

FIG. 1 is a schematic drawing of an environment 100 wherein multi-user CAx editing may be deployed. As illustrated in this figure, environment 100 may include one or more clients 102, a network 104, and a server 106. Server 106 may host shared design model 108. Clients 102 may host local model copies 110 of shared design model 108.

Clients 102 generally represent any type or form of computing device capable of reading computer-executable instructions. Examples of clients 102 include, without limitation, laptops, tablets, desktops, servers, combinations of one or more of the same, or any other suitable computing device.

Server 106 generally represents any type or form of computing device or combinations of computing devices that is capable of storing, comparing, and/or providing data, as well as providing back-end processing services. Server 106 may represent a commercial or publicly-accessible service or a service provided to a single organization. Examples of server 106 include, without limitation, high-performance clusters, virtual machines, application servers, web servers, and/or database servers configured to provide various database services and/or run software applications, or combinations of one or more of the same.

In certain embodiments, server 106 may represent combinations of software applications and physical computing systems configured to perform various tasks. For example, server 106 may include a database server that manages one or more databases, such as shared design model 108. In one example, shared design module 108 may be configured to store geometry, material, load, and/or environment data representing one or more design models. Shared design module 108 may represent portions of a single database or computing device or a plurality of databases or computing devices capable of being accessed by computing devices included in server 106 and/or clients 102.

Network 104 generally represents any medium or architecture capable of facilitating communication or data transfer. Examples of network 104 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), or the like. Network 104 may facilitate communication or data transfer using wireless or wired connections. In one embodiment, network 104 may facilitate communication between clients 102 and server 106.

Figure 2:
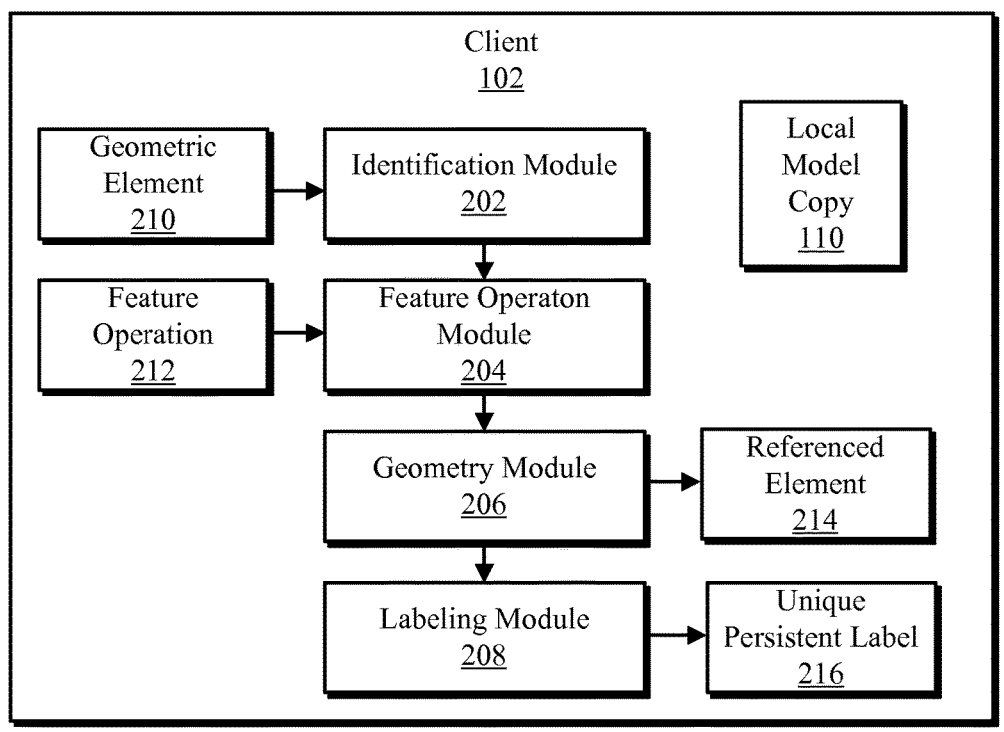
FIG. 2 is a functional block diagram depicting one embodiment of the system for multi-user CAx editing of a model of a design object.

FIG. 2 is a functional block diagram depicting one embodiment of a system 200 for multi-user CAx editing of a model of a design object. As illustrated in this figure, system 200 may include a client 102 that may include local model copy 110, as well as one or more modules for performing one or more tasks. For example, and as will be explained in greater detail below, system 200 may include an identification module 202 that identifies one or more geometric elements referenced in response to creating a feature within a model of a design object, a feature operation module 204 that receives a feature operation that references the geometric element referenced in response to creating the feature, a geometry module 206 that, in response to receiving the feature operation, identifies the geometric element referenced by the feature operation, and a labeling module 208 that generates a unique persistent label for the geometric element.

Figure 3:
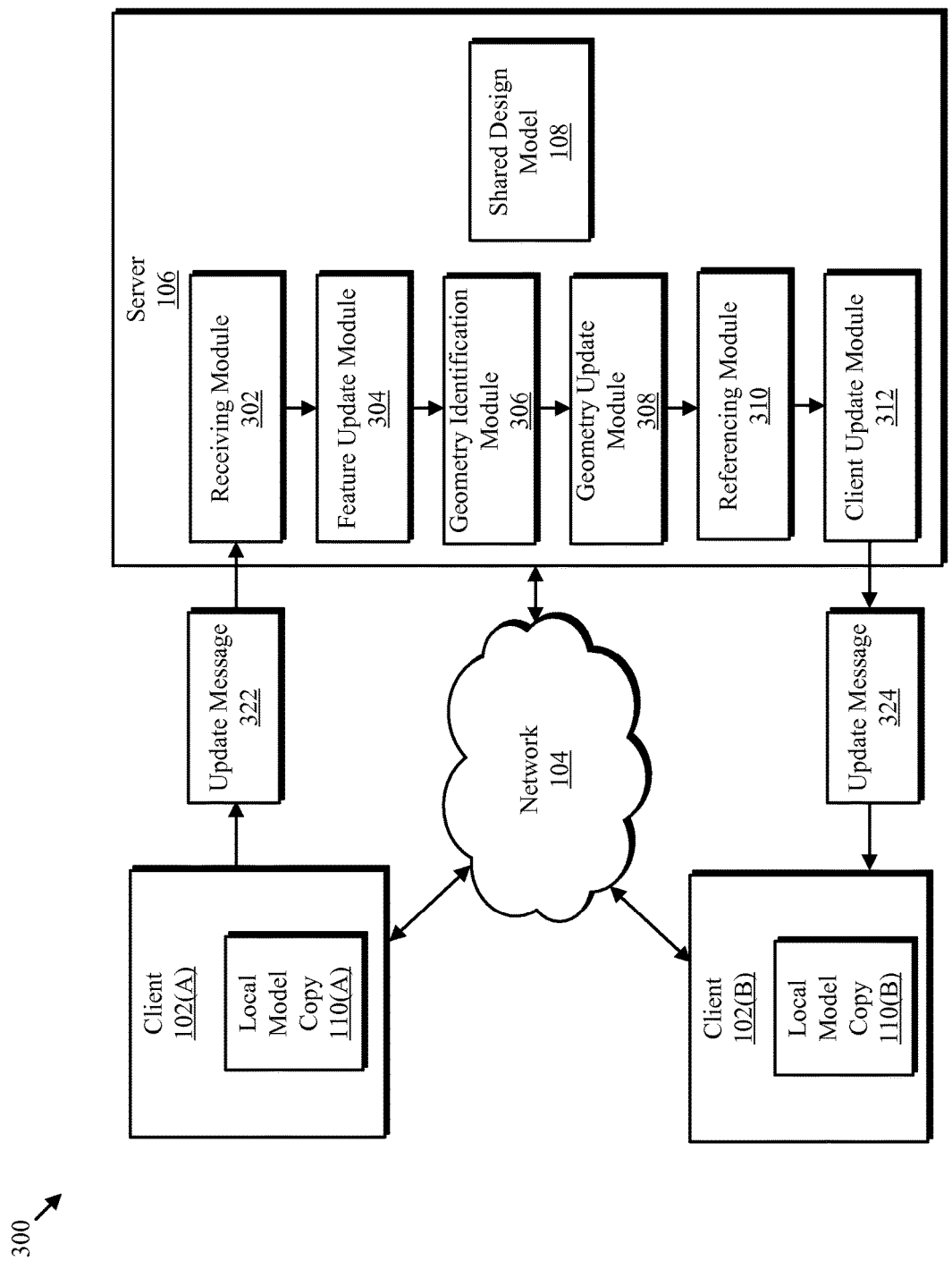
FIG. 3 is a functional block diagram depicting one embodiment of the system for multi-user CAx editing of a model of a design object.

FIG. 3 is a functional block diagram depicting one embodiment of a system 300 for multi-user CAx editing of a model of a design object. As illustrated in this figure, system 300 may include components depicted in FIG. 1, such as one or more clients 102 hosting local model copy 110, network 104, and server 106 hosting shared design model 108. As illustrated in this figure, system 300 may also include one or more modules for performing one or more tasks. For example, and as will be explained in greater detail below, system 300 may include a receiving module 302 that receives on a server storing a shared model of the design object, an update message from a client, that includes a feature operation that references one or more geometric elements of the design object, a unique persistent label for the geometric element, and one or more distinguishing parameters for the geometric element.

System 300 may also include a feature update module 304 that adds the feature operation to a feature record in a feature table of the shared model of the design object, and a geometry identification module 306 that identifies the geometric element in a geometric element record in a geometric element table of the shared model of the design object. System 300 may also include a geometry update module 308 that updates the distinguishing parameters for the geometric element in the geometric element table, and a referencing module 310 that references the geometric element in the feature record for the feature operation and references the feature operation in the geometric element record for the geometric element. System 300 may also include a client update module 312 that transmits the update message from the server to one or more additional clients.

Figure 4:
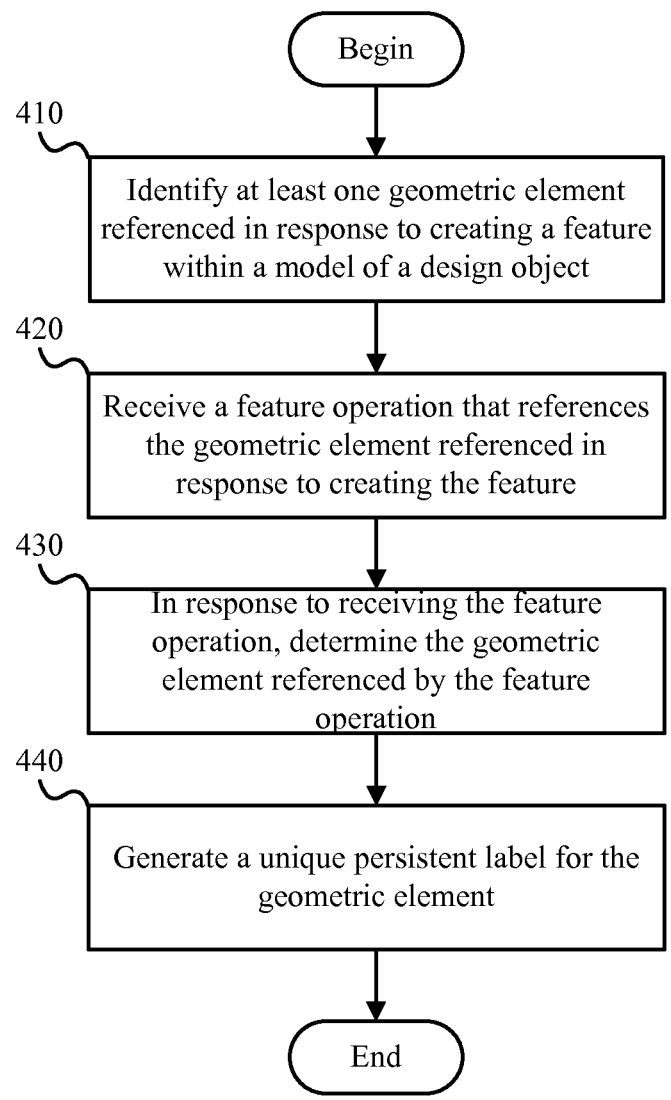
FIG. 4 is a flowchart diagram depicting one embodiment of a method for multi-user CAx editing of a model of a design object.

FIG. 4 is a flowchart depicting one embodiment of a multi-user CAx editing method 400. The steps shown in FIG. 4 may be performed by any suitable computer-executable code and/or computing system. In some embodiments, the steps shown in FIG. 4 may be performed by one or more of the components of system 100 in FIG. 1, system 200 in FIG. 2, or system 300 in FIG. 3.

As illustrated in FIG. 4, at step 410 of method 400, one or more of the systems described herein may identify one or more geometric elements referenced in response to creating a feature within the model of the design object. For example, identification module 202 may, as part of client 102 in FIG. 2, identify geometric element 210 referenced in response to creating a feature within local model copy 110 of the shared model of the design object.

The term "geometric element," as used herein, generally refers to constituents of an engineering object incorporated in representations such as plans, drawings, diagrams, schematics, blueprints, sketches, maps, or models. In one embodiment, the geometric element may include a body, a face, an edge, and/or a vertex. Identification module 202 may identify geometric elements in any suitable manner. For example, identification module 202 may receive input from a user specifying one or more geometric elements to be the object of a feature operation. In another example, identification module 202 may identify one or more geometric elements by receiving input from an automated process of a CAx system.

At step 420, one or more of the systems described herein may receive a feature operation that references the geometric element created in response to creating a feature. For example, feature operation module 204 may, as part of client 102 in FIG. 2, receive feature operation 212 that references geometric element 210 that was referenced in response to creating a feature.

Figure 6:
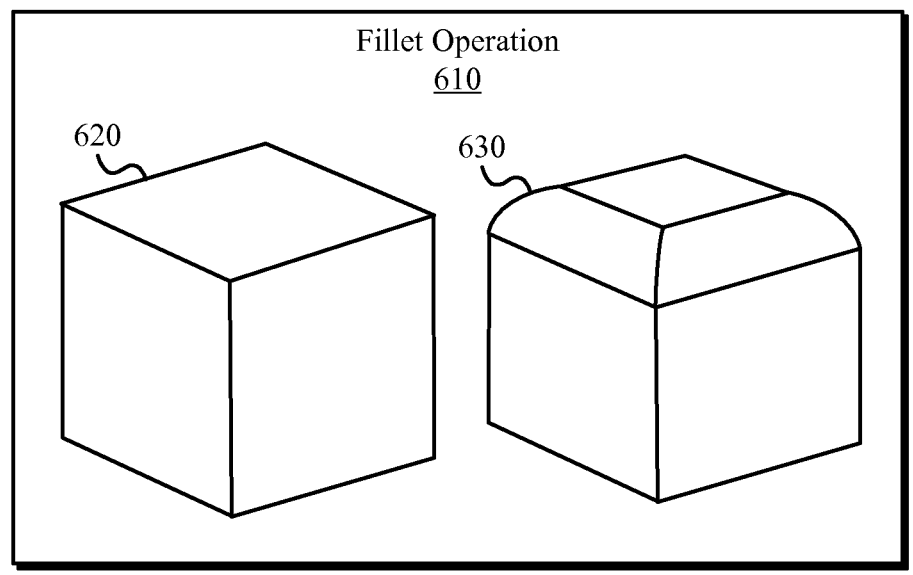
FIG. 6 is a block diagram depicting a feature operation performed on an engineering object.

The term "feature operation," as used herein, generally refers to distinctive CAx attributes that may be represented by one or more geometries or parameters. Examples of feature operations include operations to create or modify geometric elements and their associated parameters such as the shape, dimensions, composition, material properties and tolerances of an object or portion of an object, the mesh size and required accuracy for simulations, the path and tolerances for a manufacturing tool, and any other attribute that may affect the performance of a product and the manufacture thereof. For example, a feature may define a hole created in a solid geometry or a 3D extrusion of a 2D geometry. Specific examples of feature operations include fillet, chamfer, or extrusion operations that create or edit geometric elements. FIG. 6 is a block diagram depicting a feature operation 600 performed on an engineering object. Feature operation 600 includes fillet operation 610 performed on the top edges of a cube 620 to produce filleted cube 630.

Feature operation module 204 may receive a feature operation in a variety of ways. For example, feature operation module 204 may receive a feature operation from a user of a CAx system. In another example, feature operation module 204 may receive a feature operation from an automated process of a CAx system.

At step 430, one or more of the systems described herein may, in response to receiving the feature operation, identify the geometric element referenced by the feature operation. For example, geometry module 206 may, as part of client 102 in FIG. 2, identify, in response to receiving feature operation 212, referenced element 214, which may include one or more geometric elements referenced by feature operation 212.

Geometry module 206 may identify the geometric element referenced by the feature operation in any suitable matter. In example, and as will be described in greater detail below, geometry module 206 may query a CAx database for changed records in a geometric element table. Returning to FIG. 6, geometry module 206 may identify the four top edges of cube 620 as having been referenced by fillet operation 610. By identifying and naming only the geometric elements referenced by a feature operation, geometry module 206 may make fewer queries to the CAx database. For example, identifying and naming the faces and edges created or modified by fillet operation 610 would involve identifying and naming 24 edges and 10 faces in filleted cube 630, rather than the 4 edges of cube 620 referenced by fillet operation 610.

To maintain consistency between the shared model and local model copies of the design object on each client, geometric elements must be identified and specified unambiguously. Since all the geometric elements created or modified by a feature operation may not be identified and named after the operation has been performed, geometry module 206 may identify the geometric element referenced by the feature operation by identifying a body on which the geometric element resides. The term "body," as used herein, generally refers to one or more features comprising a separately identifiable portion of a 2D or 3D model of an engineering object. A body may be a portion of a model at any phase of the design or manufacturing process, or may act as a placeholder for one or more features to be defined in more detail at a later time in these processes.

In some examples, geometry module 206 may identify the body on which the geometric element resides by identifying a feature that created the body. In some examples, a feature may create multiple bodies, so identifying the feature that created the body does not uniquely identify the body. In these examples, geometry module 206 may identify the body on which the geometric element resides by identifying both the feature that created the body and the body's bounding box.

At step 440, one or more of the systems described herein may generate a unique persistent label for the geometric element. For example, labeling module 208 may, as part of client 102 in FIG. 2, generate unique persistent label 216 for the referenced element 214. The term "unique persistent label," as used herein, generally refers to a label that has not been used previously for any other geometric elements that make up the engineering object.

Labeling module 208 may generate a unique persistent label for the geometric element in a variety of ways. In one embodiment, the label comprises a random string of characters. In another embodiment, the label has concatenated information such as the username of the user operating the CAx software on the client, the type of geometric element, and an ascending numeric value.

Figure 5:
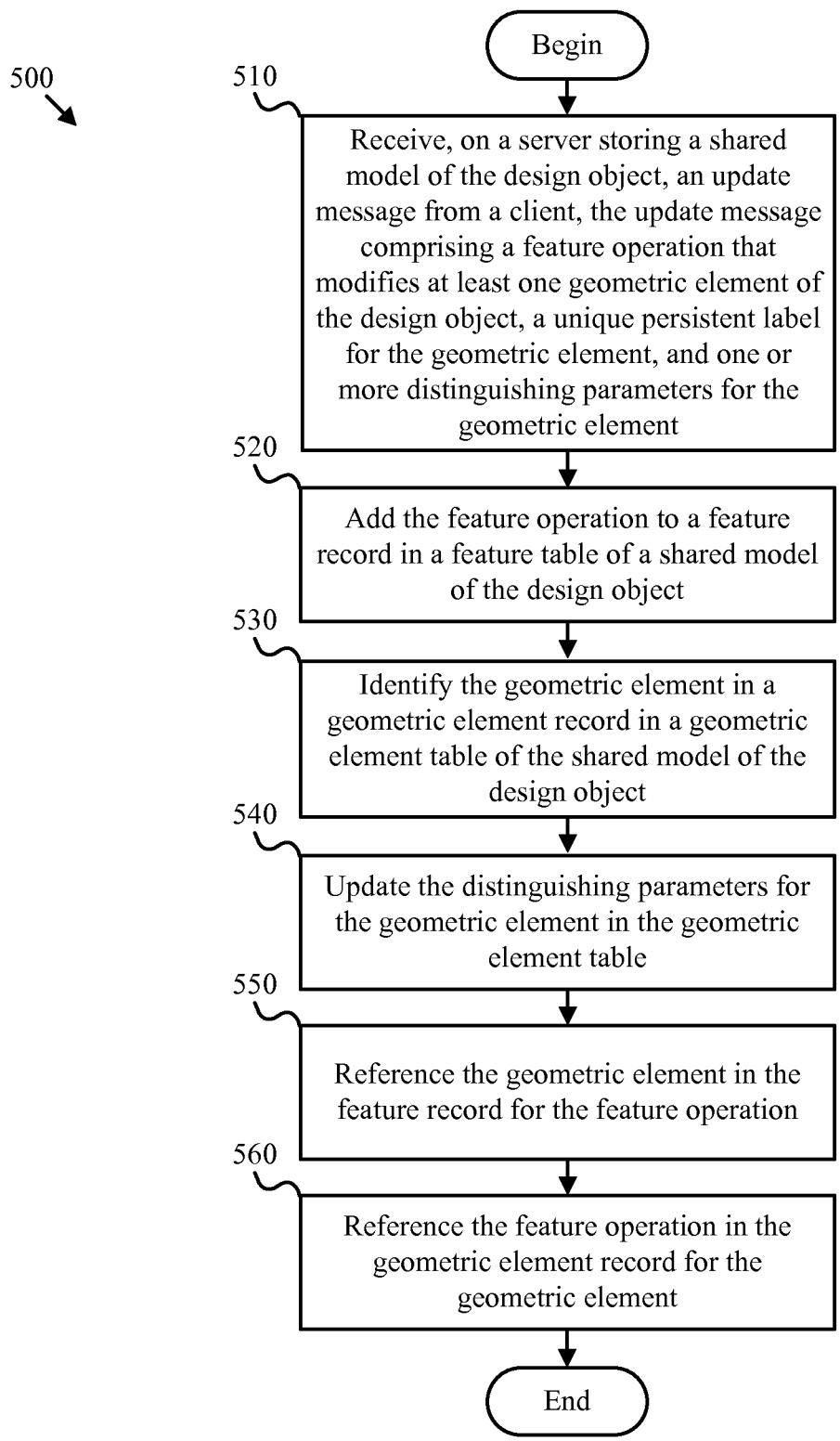
FIG. 5 is a flowchart diagram depicting one embodiment of a method for multi-user CAx editing of a model of a design object.

FIG. 5 is a flowchart depicting one embodiment of a multi-user CAx editing method 500. The steps shown in FIG. 5 may be performed by any suitable computer-executable code and/or computing system. In some embodiments, the steps shown in FIG. 5 may be performed by one or more of the components of system 100 in FIG. 1, system 200 in FIG. 2, or system 300 in FIG. 3.

As illustrated in FIG. 5, at step 510, one or more of the systems described herein may receive, on a server storing a shared model of the design object, an update message from a client that includes a feature operation that references at least one geometric element of the design object, a unique persistent label for the geometric element, and one or more distinguishing parameters for the geometric element. For example, receiving module 302 may, as part of server 106 in FIG. 3, receive on server 106, which stores shared design model 108, update message 322 from client 102(A).

Receiving module 302 may receive an update message in any suitable manner. For example, receiving module 302 may receive update message 810 in FIG. 8. Update message 810 indicates that the feature operation is a fillet operation operating on an edge identified as Edge[{(10,15,20)(5,15,20)(0,15,20)}Body_1], which has been assigned the label dan_feature_3_edge_1.

Figure 7:
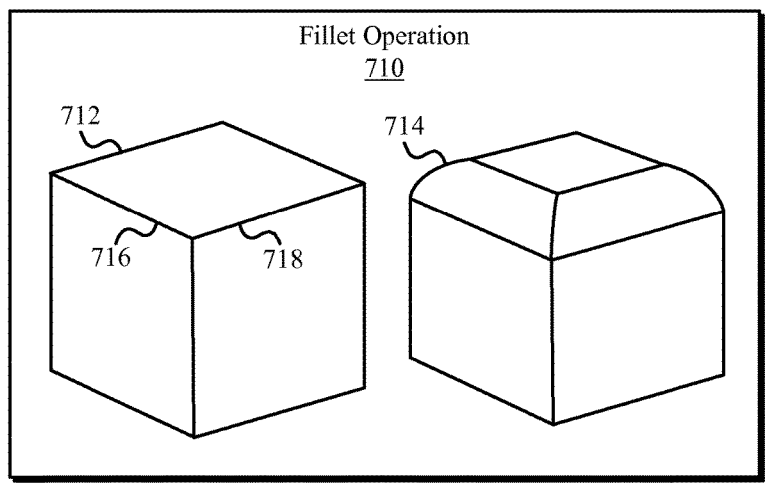
FIG. 7 is a block diagram depicting client data tables corresponding to a local model copy of an engineering object.

FIG. 7 is a block diagram depicting client data tables 700 corresponding to a local model copy of an engineering object. Client data tables 700 may include client feature table 720 and client entity dictionary 730 containing feature and geometry data with feature operations such as fillet operation 710. Fillet operation 710 operates on the top edges of cube 712 to produce filleted cube 714. A user may specify that the fillet operation is to be performed on the top face of the cube by selecting edges 716 and 718. In connection with this fillet operation, systems and methods described herein may enter a fillet feature named dan_feature_3 in client feature table 720 along with entries in client entity dictionary 730 identifying the edges (named dan_feature_3_edge_1 and dan_feature_3_edge_2) referenced by the feature operation. As shown in FIG. 3, client 102(A) may then transmit update message 322 with the necessary data to add feature operation dan_feature_3 to shared design model 108, and thereby synchronize shared design model 108 with local model copy 110(A).

At step 520, one or more of the systems described herein may add the feature operation to a feature record in a feature table of a shared model of the design object. For example, feature update module 304 may, as part of server 106 in FIG. 3, add the feature operation specified in update message 322 to a feature record in a feature table of shared design model 108.

The term "feature table," as used herein, generally refers to one or more data structures containing identifying and/or parametric data for features of an engineering object. In one embodiment, a feature table is a table in a CAx database or database management software accessible to one or more CAx systems. Feature update module 304 may add the feature operation to the feature table in any suitable manner. For example, feature update module 304 may add the feature operation data in update message 810 in FIG. 8 to database feature table 820, as illustrated. The feature operation is identified by dan_feature_3 as a feature operation of feature type fillet. As will be described in greater detail below, the feature creation data associated with the feature operation entry references the entries in database entity dictionary 830 associated with the feature operation.

Returning to FIG. 5, at step 530, one or more of the systems described herein may identify the geometric element in a geometric element record in a geometric element table of the shared model of the design object. For example, geometry identification module 306 may, as part of server 106 in FIG. 3, identify the geometric element specified in update message 322 in a geometric element record in a geometric element table of shared design model 108.

Figure 8:
FIG. 8 is a block diagram depicting database tables corresponding to a shared model of an engineering object.

The term "geometric element table," as used herein, generally refers to one or more data structures containing identifying and/or parametric data for geometric elements comprising features of an engineering object. In one embodiment, a geometric element table is a table in a CAx database or database management software accessible to one or more CAx systems. Geometry identification module 306 may identify the geometric element in the geometric element table in any suitable manner. In one embodiment, geometry identification module 306 identifies the geometric element specified in the update message by searching the geometric element table using the unique persistent label for the geometric element. For example, as shown in FIG. 8, the fillet operation identified as dan_feature_3 in database feature table 820 is associated with two geometries in database entity dictionary 830, one of which is an edge geometry with the entity name dan_feature_3_edge_2. Geometry identification module 306 may identify edge geometry dan_feature_3_edge_2 by its entity name when referenced in an update message.

The feature identified by feature name dan_feature_3 in database feature table 920 is also associated with an edge geometry in database entity dictionary 830 with no entity name, but with geometric ID Edge[{(10,15,20)(5,15,20)(0,15,20)}Body_1]. This edge geometry may not have been assigned an entity name because it has not yet been referenced by a feature operation, and therefore never assigned a unique persistent label. In one embodiment, the geometry identification module identifies the geometric element in the geometric element table by searching the geometric element table using the distinguishing parameters for the geometric element and adds the unique persistent label for the geometric element to the geometric element table. For example, if geometry identification module 306 receives the data included in update message 810, geometry identification module 306 may search database entity dictionary 830 for a geometry with entity name dan_feature_3_edge_1. When no geometry with that name is found, geometry identification module 306 may search for a geometry with distinguishing parameters Edge[{(10,15,20)(5,15,20)(0,15,20)}Body_1] and identify the unnamed edge geometry associated with the feature named dan_feature_3. Geometry identification module 306 may then assign the unique persistent label dan_feature_3_edge_1 to the geometry.

Storing feature data and geometry data in separate database tables allows geometry data to be modified without identifying the feature and any dependent features with which the geometries are associated. A geometry may be associated with many features dependent on the feature that created the geometry, and not having to identify all the feature dependencies associated with a geometry may eliminate many database queries, which greatly increases the processing time involved in modifying a geometry.

At step 540, one or more of the systems described herein may update the distinguishing parameters for the geometric element in the geometric element table. For example, geometry update module 308 may, as part of server 106 in FIG. 3, update the distinguishing parameters for the geometric element identified in update message 322 in the geometric element table included in shared design model 108.

Geometry update module 308 may update the distinguishing parameters for the geometric element in any suitable manner. For example, geometry update module 308 may, as illustrated in FIG. 8, update the geometric ID field in the entry for the geometry in database entity dictionary 830 with the distinguishing parameters included in update message 810.

At step 550, one or more of the systems described herein may reference the geometric element in the feature record for the feature operation. For example, referencing module 310 may, as part of server 106 in FIG. 3, reference the geometric element identified in update message 322 in the feature record for the feature operation in the database feature table in shared design module 108.

The term "referencing," as used herein, generally refers to including in a database record a key identifying an associated record in another database table, as part of a database normalization process. For example, as shown in FIG. 8, referencing module 310 may include feature creation data 11625 in the database feature table 820 record for dan_feature_3, indicating a record number of a geometry in database entity dictionary 830 associated with dan_feature_3.

At step 560, one or more of the systems described herein may reference the feature operation in the geometric element record for the geometric element. For example, referencing module 310 may, as part of server 106 in FIG. 3, reference the feature operation in the geometric element record for the geometric element in the database entity dictionary 830 in shared design model 108.

Referencing module 310 may reference the feature operation in the database entity dictionary in any suitable manner. For example, referencing module 310 may reference the associated feature by name or by the record key for the feature record in database feature table 820.

When the shared design model 108 has been updated with the function operation performed on the client and transmitted to the server in an update message, systems and methods described herein may update additional clients with the function operation data, thereby synchronizing the local model copies stored on the additional clients with the shared design model and the local model copy of the client that initiated the function operation. For example, client update module 312, as part of server 106 in FIG. 3, may update local model copy 110(B) on client 102(B) by transmitting update message 324, which contains the same data receiving module 302 received from client 102(A) in update message 322. Client database tables 700 illustrated in FIG. 7 show how client database tables 700 mirror the shared database tables 800 shown in FIG. 8. Client entity dictionary 730 may be cached in memory to allow maximum speed of access, and may include an entity memory pointer to the geometric element on the client.

As described above, the systems and methods described herein may provide a high level of performance for multi-user CAx systems by identifying and naming geometric elements only when they are referenced by a feature operation, as opposed to identifying and naming every newly created geometric element when a feature operation creates a feature. Systems and methods described herein may provide additional performance increases by normalizing feature and geometric element data, storing feature data and geometric element data in separate database tables and referencing geometric elements associated with a feature in the database feature table as well as the associated feature in the database entity dictionary.

In summary, the methods, apparatuses, and systems presented herein provide a number of distinct advantages over prior art methods, apparatuses, and systems. It should be noted that many of the functional units described herein are identified as modules. Others are assumed to be modules. Others are assumed to be modules. One of skill in the art will appreciate that the various modules described herein may include a variety of hardware components that provide the described functionality including one or more processors such as CPUs or microcontrollers, or programmable logic devices (i.e., hardware components) that are configured by one or more software components. The software components may include executable instructions or codes and corresponding data that are stored in a computer-readable storage medium such as a non-volatile memory, or the like. The instructions or codes may include machine codes that are configured to be executed directly by the processor. Alternatively, the instructions or codes may be configured to be executed by an interpreter, or the like, that translates the instructions or codes to machine codes that are executed by the processor.

It should also be understood that this description is not intended to limit the invention. On the contrary, the exemplary embodiments are intended to cover alternatives, modifications, and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method, executed by one or more computers, for multi-user CAx editing of a model of a design object, the method comprising:
   creating a geometric element;
   while maintaining a feature record that records an order in which feature operations are performed in editing the model of the design object, delaying identifying and naming the geometric element until a feature operation references the geometric element;
   identifying the geometric element in response to creating a feature within the model of the design object that references the geometric element, wherein identifying the geometric element comprises identifying a body on which the geometric element resides and identifying a feature that created the body;
   receiving a feature operation that references the geometric element referenced in response to creating the feature;
   in response to receiving the feature operation, identifying the geometric element referenced by the feature operation; and
   generating a unique persistent label for the geometric element after the geometric element is referenced by the feature operation and assigning the unique persistent label to the geometric element.

2. The method of claim 1, wherein the geometric element comprises one of:
   a body;
   a face;
   an edge;
   a vertex.

3. The method of claim 1, wherein identifying the geometric element by the feature operation comprises identifying a body on which the geometric element resides.

4. The method of claim 3, wherein identifying the body on which the geometric element resides comprises at least one of:
   identifying a feature that created the body;
   identifying a bounding box encompassing the body.

5. A method, executed by one or more computers, for multi-user CAx editing of a model of a design object, the method comprising:
   receiving, on a server storing a shared model of the design object, an update message from a client, the update message comprising a feature operation that references a geometric element, previously unidentified and unnamed, of the design object, a unique persistent label for the geometric element, and one or more distinguishing parameters for the geometric element;
   adding the feature operation to a feature record in a feature table of the shared model of the design object, wherein the feature record records an order in which feature operations are performed in editing the model of the design object;
   searching a geometric element table for the unique persistent label, the geometric element table store on the server;
   upon searching the geometric element table for the unique persistent label and not finding the unique persistent label, identifying the geometric element in the geometric element table of the shared model of the design object by identifying the distinguishing parameters for the geometric element;
   updating the distinguishing parameters for the geometric element in the geometric element table and assigning the unique persistent label to the geometric element after receiving the update message comprising the feature operation that references the geometric element;
   referencing the geometric element in the feature record for the feature operation;
   referencing the feature operation in the geometric element record for the geometric element.

6. The method of claim 5, further comprising transmitting the update message to at least one additional client.

7. The method of claim 5, wherein identifying the geometric element in the geometric element table comprises searching the geometric element table using the unique persistent label for the geometric element.

8. The method of claim 5, wherein identifying the geometric element in the geometric element table comprises:
   searching the geometric element table using the distinguishing parameters for the geometric element;
   adding the unique persistent label for the geometric element to the geometric element table.

9. A system for multi-user CAx editing of a model of a design object, the system comprising:
- an identification module, stored in memory, that, while maintaining a feature record that records an order in which feature operations are performed in editing the model of the design object, delays identifying and naming at least one geometric element until a feature operation references the geometric element and further identifies the at least one geometric element in response to creating a feature within the model of the design object that references the geometric element;
- a feature operation module, stored in memory, that receives a feature operation that references the geometric element referenced in response to creating the feature;
- a geometry module that, in response to receiving the feature operation, identifies the geometric element referenced by the feature operation;
- a labeling module, stored in memory, that generates a unique persistent label for the geometric element and assigns the unique persistent label to the geometric element after the geometric element is referenced by the feature operation; and
- at least one physical processor configured to execute the identification module, the feature operation module, the geometry module, and the labeling module.

10. The system of claim 9, wherein the geometric element comprises one of:
- a body;
- a face;
- an edge;
- a vertex.

11. The system of claim 9, wherein the geometry module identifies the geometric element referenced by the feature operation by identifying a body on which the geometric element resides.

12. The system of claim 11, wherein the geometry module identifies the body on which the geometric element resides by at least one of:
- identifying a feature that created the body;
- identifying a bounding box encompassing the body.

13. A system for multi-user CAx editing of a model of a design object, the system comprising:
- a receiving module, stored in memory, that receives on a server storing a shared model of the design object, an update message from a client, the update message comprising:
  - a feature operation that references a geometric element, previously unidentified and unnamed, of the design object;
  - a unique persistent label for the geometric element;
  - one or more distinguishing parameters for the geometric element;
- a feature update module, stored in memory, that adds the feature operation to a feature record in a feature table of the shared model of the design object, wherein the feature record records an order in which feature operations are performed in editing the model of the design object;
- a geometry identification module, stored in memory, that, upon searching a geometric element table for the unique persistent label and not finding the unique persistent label, identifies the geometric element record in the geometric element table of the shared model of the design object by identifying the distinguishing parameters associated with an unnamed entity, the geometric element table store on the server;
- a geometry update module, stored in memory, that updates the distinguishing parameters for the geometric element in the geometric element table and assigns the unique persistent label to the geometric element after the geometric element is referenced by the feature operation;
- a referencing module, stored in memory, that:
  - references the geometric element in the feature record for the feature operation;
  - references the feature operation in the geometric element record for the geometric element; and
- at least one physical processor configured to execute the receiving module, the feature update module, the geometry identification module, the geometry update module, and the referencing module.

14. The system of claim 13, further comprising a client update module, stored in memory, that transmits the update message from the server to at least one additional client.

15. The system of claim 13, wherein the geometry identification module identifies the geometric element in the geometric element table by searching the geometric element table using the unique persistent label for the geometric element.

16. The system of claim 13, wherein the geometry identification module:
- identifies the geometric element in the geometric element table by searching the geometric element table using the distinguishing parameters for the geometric element;
- adds the unique persistent label for the geometric element to the geometric element table.

* * * * *